United States Patent
Oh et al.

(10) Patent No.: US 9,515,121 B2
(45) Date of Patent: Dec. 6, 2016

(54) LIGHT EMITTING DIODE AND METHOD OF FABRICATING THE SAME

(71) Applicant: Seoul Viosys Co., Ltd., Ansan-si (KR)

(72) Inventors: Se Hee Oh, Ansan-si (KR); Seom Geun Lee, Ansan-si (KR); Yeo Jin Yoon, Ansan-si (KR); Hyun Haeng Lee, Ansan-si (KR); Mae Yi Kim, Ansan-si (KR)

(73) Assignee: SEOUL VIOSYS CO., LTD., Ansan-Si (KR)

( * ) Notice: Subject to any disclaimer, the term of this patent is extended or adjusted under 35 U.S.C. 154(b) by 0 days.

(21) Appl. No.: 14/631,062

(22) Filed: Feb. 25, 2015

(65) Prior Publication Data

US 2015/0243706 A1 Aug. 27, 2015

(30) Foreign Application Priority Data

Feb. 27, 2014 (KR) ........................ 10-2014-0023487

(51) Int. Cl.
*H01L 33/20* (2010.01)
*H01L 27/15* (2006.01)
(Continued)

(52) U.S. Cl.
CPC ................ *H01L 27/15* (2013.01); *H01L 33/20* (2013.01); *H01L 33/38* (2013.01); *H01L 33/62* (2013.01);
(Continued)

(58) Field of Classification Search
CPC ...................................................... H01L 33/20
See application file for complete search history.

(56) References Cited

U.S. PATENT DOCUMENTS 5,869,848 A * 2/1999 Nobori ................ H01L 33/0008
257/95
2005/0017258 A1* 1/2005 Fehrer ..................... H01L 33/20
257/98
(Continued)

FOREIGN PATENT DOCUMENTS

TW 200832759 8/2008
TW 201318205 5/2013

OTHER PUBLICATIONS

Office Action for related Taiwan Application, Dec. 14, 2015, 9 pages.

*Primary Examiner* — Benjamin Sandvik
(74) *Attorney, Agent, or Firm* — Perkins Coie LLP

(57) ABSTRACT

An exemplary light emitting diode includes a substrate; a first light emitting cell and a second light emitting cell disposed over the substrate and separated from each other; and an interconnection electrically connecting the first light emitting cell to the second light emitting cell. Each of the first and second light emitting cells includes a first conductive-type semiconductor layer, a second conductive-type semiconductor layer disposed over the first conductive-type semiconductor layer, and an active layer disposed between the first conductive-type semiconductor layer and the second conductive-type semiconductor layer. At least one of the first light emitting cell and the second light emitting cell includes a side surface inclined with respect to the substrate. The side surface includes a first inclined portion forming an acute angle with respect to the substrate, a second inclined portion forming an obtuse angle with respect to the substrate, and an inclination discontinuity section.

20 Claims, 7 Drawing Sheets

(51) Int. Cl.
    *H01L 33/62* (2010.01)
    *H01L 33/38* (2010.01)
(52) U.S. Cl.
    CPC ............ *H01L 2933/0016* (2013.01); *H01L 2933/0066* (2013.01)

(56) References Cited

U.S. PATENT DOCUMENTS

| | | | |
|---|---|---|---|
| 2006/0197094 A1* | 9/2006 | Sugawara | H01L 33/20 257/79 |
| 2010/0148190 A1 | 6/2010 | Kim et al. | |
| 2010/0176418 A1* | 7/2010 | Muraki | H01L 33/20 257/103 |
| 2011/0086453 A1* | 4/2011 | Kim | H01L 27/153 438/31 |
| 2011/0210311 A1 | 9/2011 | Kim et al. | |
| 2012/0214266 A1* | 8/2012 | Miyachi | H01L 33/0079 438/28 |
| 2013/0306997 A1 | 11/2013 | Lim et al. | |
| 2014/0159071 A1* | 6/2014 | Choi | H01L 27/15 257/88 |

* cited by examiner (a)

(b)

(a)

(b)

LIGHT EMITTING DIODE AND METHOD OF FABRICATING THE SAME

PRIORITY CLAIMS AND CROSS-REFERENCE TO RELATED APPLICATION

This patent document claims priority and benefits of Korean Patent Application No. 10-2014-0023487, filed on Feb. 27, 2014, the contents of which are incorporated by reference.

TECHNICAL FIELD

This patent document relates to a light emitting device and a method of fabricating the same including a light emitting device. In exemplary embodiments, the light emitting device has a stable interconnection structure in which plural light emitting cells are electrically connected to each other on a single substrate.

BACKGROUND

Light emitting devices refer to semiconductor devices that emit light generated by recombination of electrons and holes, and are used in variety of fields such as displays, vehicle lamps, general lighting devices, and the like. Particularly, since light emitting devices including nitride semiconductors such as (Al,Ga, In)N have long lifespan, low power consumption, and rapid response rate, lighting apparatuses including such light emitting devices are expected to replace exiting light sources in the art.

SUMMARY

Examples of implementations of the disclosed technology provide a light emitting diode including a plurality of light emitting cells connected to each other through a stable interconnection structure and having increased effective luminous area.

Examples of implementations of the disclosed technology provide a method of fabricating a light emitting diode having a plurality of light emitting cells, in which the plurality of light emitting cells are connected to each other through a stable interconnection structure while increasing an effective luminous area.

In accordance with one exemplary embodiment, a light emitting diode is provided to include: a substrate; a first light emitting cell and a second light emitting cell disposed over the substrate and separated from each other; and an interconnection electrically connecting the first light emitting cell to the second light emitting cell, wherein each of the first and second light emitting cells includes a first conductive-type semiconductor layer, a second conductive-type semiconductor layer disposed over the first conductive-type semiconductor layer, and an active layer disposed between the first conductive-type semiconductor layer and the second conductive-type semiconductor layer; at least one of the first and second light emitting cells includes a side surface inclined with respect to the substrate; and the side surface includes a first inclined portion forming an acute angle with respect to the substrate, a second inclined portion forming an obtuse angle with respect to the substrate, and an inclination discontinuity section disposed between the first inclined portion and the second inclined portion.

In some implementations, the interconnection can be disposed over the second inclined portion.

In some implementations, each of the first and second light emitting cells can include the side surface with side surfaces of the light emitting cells disposed to face each other, and the second inclined portion of the side surface of the first light emitting cell is disposed at a location corresponding to the second inclined portion of the side surface of the second light emitting cell.

In some implementations, the side surface of each of the first and second light emitting cells include the first inclined portion on a region different from the location of the second inclined portion.

In some implementations, the first conductive-type semiconductor layer can have a greater thickness than the second conductive-type semiconductor layer.

In some implementations, each of the first and second light emitting cells can further include a transparent electrode layer disposed over at least a portion of the first and second light emitting cells, and the interconnection can be disposed over the transparent electrode layer.

In some implementations, the light emitting diode can further include a current blocking layer disposed over at least a portion of the second light emitting cell, wherein the current blocking layer can be disposed under the transparent electrode layer to correspond to the interconnection.

In some implementations, the current blocking layer can further extend to the side surface of the second light emitting cell and a region between the first light emitting cell and the second light emitting cell. The extended current blocking layer is disposed over the second inclined portion of the second light emitting cell.

In some implementations, the transparent electrode layer can further extend the side surface of the second light emitting cell and the region between the first light emitting cell and the second light emitting cell to be disposed over the current blocking layer.

In some implementations, the current blocking layer can include a distributed Bragg reflector.

In some implementations, the light emitting diode can further include a protective layer covering the first and second light emitting cell except a region in which the interconnection is disposed.

In some implementations, the light emitting diode can further include an additional light emitting cell electrically connected to the light emitting cell via the interconnection. In some implementations, a side surface of the additional light emitting cell facing the side surface of the light emitting cell includes a first inclined portion forming an acute angle with respect to the substrate and a second inclined portion forming an obtuse angle with respect to the substrate.

In accordance with another exemplary embodiment, a light emitting diode is provided to include: a substrate; and a first light emitting cell disposed over the substrate, wherein the first light emitting cell includes a side surface inclined with respect to the substrate and wherein the side surface includes a first inclined portion forming an acute angle with respect to the substrate, a second inclined portion forming an obtuse angle with respect to the substrate, and an inclination discontinuity section disposed between the first inclined portion and the second inclined portion.

In some implementations, the light emitting diode can further include at least one additional light emitting cell electrically connected to the light emitting cell, wherein a side surface of the additional light emitting cell facing the first side surface of the first light emitting cell can include a first inclined portion forming an acute angle with respect to the substrate and a second inclined portion forming an obtuse angle with respect to the substrate.

In accordance with a further exemplary embodiment, a method of fabricating a light emitting diode is provided. The method includes: disposing a first light emitting cell and a second light emitting cell separated from each other over a substrate to have a stack structure including a first conductive-type semiconductor layer, an active layer, and a second conductive-type semiconductor layer; forming on at least one of the first and second light emitting cells a side surface inclined with respect to the substrate, the side surface including a first inclined portion forming a first angle with respect to the substrate, a second inclined portion forming a second angle with respect to the substrate, the second angle being different from the first angle; and forming an interconnection electrically connecting the first light emitting cell to the second light emitting cell.

In some implementations, the interconnection can be disposed over the second inclined portion to form in a step coverage shape.

In some implementations, the forming the side surface includes disposing the side surface on each of the first and second light emitting cells so as to have the side surfaces of the first and second light emitting cells face each other, and the second inclined portion of the side surface of the first light emitting cell can be formed at a location corresponding to the second inclined portion of the side surface of the second light emitting cell.

In some implementations, the forming the side surface includes the forming the first inclined portion in at least one of the first and second light emitting cells by wet etching a portion of the side surface of at least one of the first and second light emitting cells.

In some implementations, the forming the side surface includes forming the second inclined portion in at least one of the first and second light emitting cells by covering another portion of the side surface of the at least one of the first and second light emitting cells using a mask during the disposing of the first inclined portion; and forming the second inclined portion by partially dry etching the other portion covered by the mask in which the first inclined portion is not formed.

In some implementations, the method can further include: forming a transparent electrode layer over the first and second light emitting cells before the formation of the interconnection.

In some implementations, the method can further include: forming a current blocking layer over the second light emitting cell before the formation of the transparent electrode layer at a position corresponding to the interconnection.

According to various implementations of the present disclosure, a portion of side surfaces of a plurality of light emitting cells are formed to have a regular inclination and another portion of side surfaces of light emitting cells are formed to have an inverse inclination, thereby increasing an effective luminous area while having a stable interconnection structure. Therefore, a light emitting diode including the plurality of light emitting cell can have an inversely inclined side surface.

DETAILED DESCRIPTION

Figure 1:
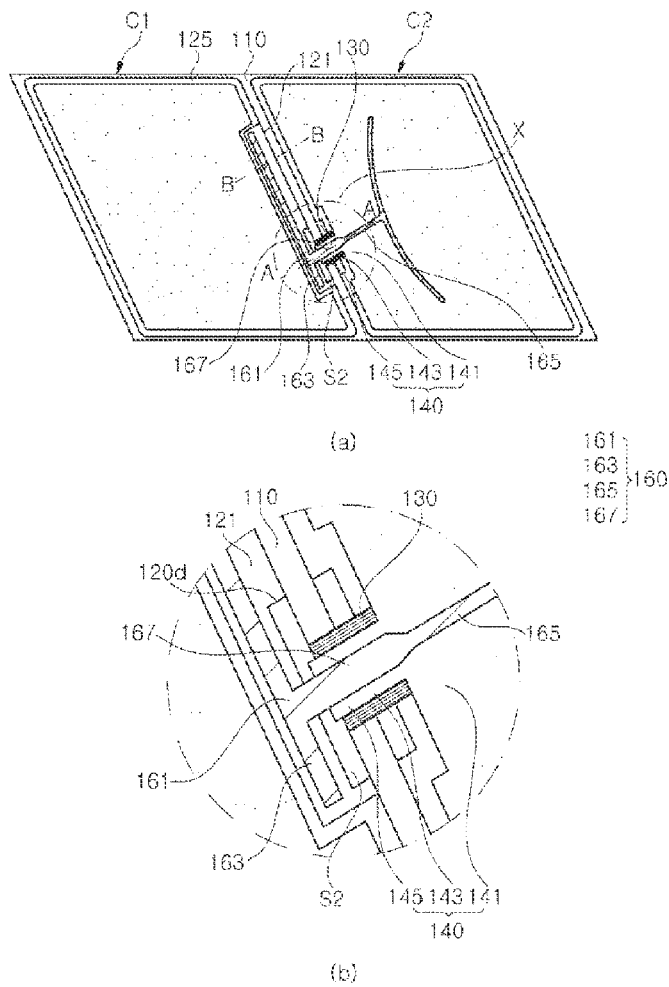
FIG. 1 through FIG. 3 show a plan view and cross-sectional views of an exemplary light emitting diode according to some implementations of the disclosed technology.

Hereinafter, exemplary implementations of the disclosed technology will be described in detail with reference to the accompanying drawings. It should be understood that the following implementations are provided to facilitate understanding of examples of the disclosed technology. Thus, it should be understood that the disclosed technology is not limited to the following implementations and can be provided in different ways. In addition, it should be noted that the drawings are not to precise scale and some of the dimensions, such as width, length, thickness, and the like, can be exaggerated for convenience of description. It will be understood that when an element such as a layer, film, region or substrate is referred to as being formed, placed or disposed "above" or "on" another element, it can be directly formed, placed or disposed on the other element or intervening elements can also be present. Like components will be denoted by like reference numerals throughout the specification.

Among light emitting devices, a light emitting diode has a junction between a p-type semiconductor and an n-type semiconductor and is based on a principle that light is emitted in the course of transition of electrons when the electrons of the n-type semiconductor recombine with the holes of the p-type semiconductor. The light emitting diode is driven to emit light by forward current and requires supply of direct current (DC) power. Thus, when the light emitting diode is directly connected to an alternating current (AC) power source, the light emitting diode repeats on or off operation depending upon a direction of electric current. Thus, the light emitting diode is easily damaged by reverse current and cannot continuously emit light.

Light emitting diodes can be implemented to directly connection to a high voltage AC power source via an air bridge interconnection. However, an air-bridge interconnection between the light emitting diodes can be easily broken by external force and can cause short circuit due to deformation by the external force. The fragility of air bridge interconnections in AC light emitting diodes can be potentially fortified by using a structure in which light emitting cells are electrically connected to each other via an interconnection formed through a so-called step coverage process.

Luminous efficiency of a given light emitting diode can be divided into internal quantum efficiency and external quantum efficiency. Particularly, light extraction efficiency is expressed by the ratio of generated photons to photons emitted outside without extinction through total reflection inside the light emitting diode.

To improve the light extraction efficiency, an inclined surface can be formed on a side surface of a single light emitting diode. For example, an inclined structure can be formed on a side surface such that the side surface has a gradually decreasing width in a downward direction. Thus, in a single light emitting diode, an acute angle can be defined between at least one side surface of semiconductor layers and an upper surface of a substrate to form an inverse inclination on the side surface.

When an inverse inclination is formed on a side surface in each of plural light emitting cells, it is difficult to form an interconnection for electrical connection between the light emitting cells. Particularly, the inverse inclination formed on the side surface of each of the light emitting cells makes it difficult to form a stop coverage interconnection corresponding to the surface of the light emitting cell.

An inclined side surface can be formed on each of plural light emitting cells such that an obtuse angle is defined between an upper surface of the substrate and the side surface of each of the light emitting cells. In this case, however, a typical light emitting diode including a plurality of light emitting cells tend to have a reduced effective luminous area, thereby causing an increase in forward voltage and decrease in luminous efficiency.

The disclosed technology provides for a light emitting device with an improved luminous efficiency by increasing the effective luminous area. The disclosed technology include various implementations including incorporating a stable interconnection structure in which plural light emitting cells are electrically connected to each other on a single substrate.

Figure 2:
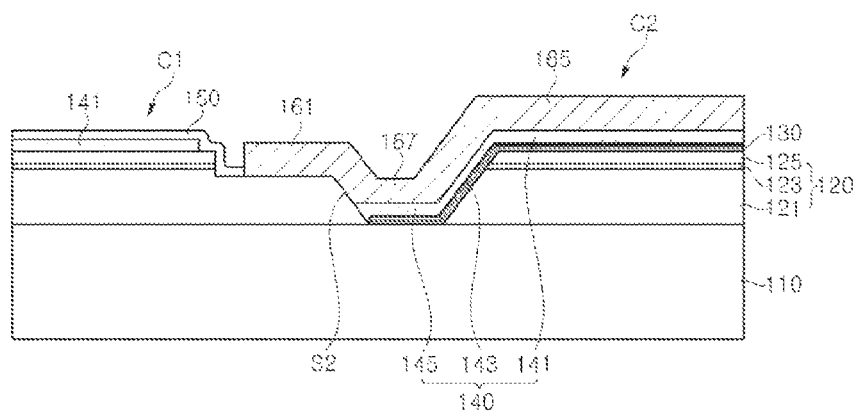
Figure 3:
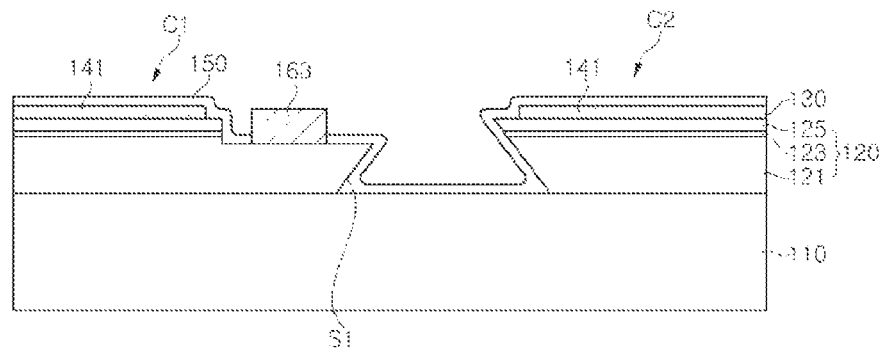

FIG. 1 through FIG. 3 show a plan view and cross-sectional views of a light emitting diode according to some implementations of the disclosed technology. Specifically, FIG. 1 is a plan view of an exemplary light emitting diode according to some implementations of the disclosed technology. Further, FIG. 1(b) is an enlarged view of region X of FIG. 1(a). FIG. 2 and FIG. 3 are sectional views taken along line A-A and line B-B of FIG. 1 respectively.

Referring to FIG. 1 to FIG. 3, the light emitting diode according to this exemplary implementation includes a substrate 110, light emitting cells C1 and C2, and an interconnection 160. The light emitting diode can further include a current blocking layer 130, a transparent electrode layer 140, and a protective layer 150.

The substrate 110 can be or include an insulating or conductive substrate, and can include a substrate capable of growing the semiconductor layers 120 thereon. The substrate 110 can include, for example, a sapphire substrate, a silicon substrate, a silicon carbide substrate, an aluminum nitride substrate, or a gallium nitride substrate. In this exemplary embodiment, the substrate 110 can be or include a patterned sapphire substrate (PSS) including a convex-concave pattern (not shown) on an upper surface thereof.

The light emitting cells C1 and C2 are disposed on the substrate 110, and can include a first light emitting cell C1 and a second light emitting cell C2. The first light emitting cell C1 and the second light emitting cell C2 can be separated from each other and are disposed on the same substrate 110. The light emitting cells C1 and C2 can have various sizes and shapes. For example, the light emitting cells C1 and C2 can have a parallelogram-shaped horizontal cross-section, however, other cross-sectional shape can be also applied to the light emitting cells C1 and C2.

Each of the first and second light emitting cells C1 and C2 can include a first conductive-type semiconductor layer 121, an active layer 123 disposed on the first conductive-type semiconductor layer 121, and a second conductive-type semiconductor layer 125 disposed on the active layer 123.

The first conductive-type semiconductor layer 121 and the second conductive-type semiconductor layer 125 can include a nitride-based semiconductor such as (Al, Ga, In)N. The first conductive-type semiconductor layer 121 can be doped with n-type impurities including S1 to become an n-type semiconductor layer, and the second conductive-type semiconductor layer 125 can be doped with p-type impurities including Mg to become a p-type semiconductor layer. The above implementation is one of examples of the first and second conductive-type semiconductor layers 120 and 125 and the first and second conductive-type semiconductor layers 121 and 125 can be formed as different conductive type semiconductor layers from the aforementioned conductive type semiconductor layers. For example, the first conductive-type semiconductor layer 121 can include n-type GaN and the second conductive-type semiconductor layer 125 can include p-type GaN.

The active layer 123 can include a nitride-based semiconductor such as (Al, Ga, In)N. In addition, the active layer 123 can include a multi-quantum well (MQW) structure, and elements and compositions of the semiconductor layers can be adjusted to allow the semiconductor layers forming the multi-quantum well (MQW) structure to emit light having desired peak wavelengths.

Hereinafter, a description of well-known features of the semiconductor layers 120 including the nitride-based semiconductor will be omitted.

Each of the first and second light emitting cells C1 and C2 can include side surfaces inclined with respect to the substrate 110, and the inclined side surfaces of the first and second light emitting cells C1 and C2 can include a first inclined portion S1 and a second inclined portion S2. Further, the first light emitting cell C1 and/or the second light emitting cell C2 can include a side surface, which includes the first inclined portion S1 and the second inclined portion S2 and is parallel to one edge of the substrate 110. Accordingly, the side surface can include an inclination discontinuity section 120d formed near a boundary between the first inclined portion S1 and the second inclined portion S2.

As shown in FIG. 3, the first inclined portion S1 can have an acute angle defined between the side surface thereof and an upper surface of the substrate 110. For example, the first inclined portion S1 can have an angle of about 20° to about 50° with respect to the upper surface of the substrate 110. Herein, when an angle defined between a side surface of the light emitting cell and the upper surface of the substrate 110 is an acute angle, the corresponding side surface is defined as an inversely inclined side surface. Thus, the first inclined portion S1 can be or include an inversely inclined side surface section.

As shown in FIG. 2, the second inclined portion S2 can have an obtuse angle defined between the side surface thereof and the upper surface of the substrate 110. For example, the second inclined portion S2 can have an angle of about 110° to about 170.° Other angles are possible including for example, the second inclined portion S2 can have an angle of about 150° to about 160°, with respect to the upper surface of the substrate 110. Herein, when an angle defined between a side surface of the light emitting cell and the upper surface of the substrate 110 is an obtuse angle, the corresponding side surface is defined as a regularly inclined side surface. Thus, the second inclined portion S2 can be or include a regularly inclined side surface section.

Each of the first and second light emitting cells C1 and C2 can have a side surface facing the side surface of the other light emitting cell. The side surfaces of the first and second light emitting cells that face each other can have a second inclined portion S2 that is regularly inclined, and a first inclined portion S1 that is inversely inclined. The first inclined portion S1 is formed at least part of other regions of the side surface excluding the region where the second inclined portion S2 is formed. Accordingly, the first light emitting cell C1 and/or the second light emitting cell C2 can include the side surface that includes both the first inclined portion S1 and the second inclined portion S2. Accordingly, the side surface can further include an inclination discontinuity section at which an inclination is disconnected at the boundary between the first inclined portion S1 and the second inclined portion S2.

As shown in FIG. 1, the second inclined portion S2 can be formed under a region, in which the interconnection 160 is formed, between the first light emitting cell C1 and the second light emitting cell C2, and the first inclined portion S1 can be formed in other regions of the side surface. The region in which the second inclined portion S2 is formed can have a greater width than the interconnection 160, whereby the interconnection 160 can be stably formed on the light emitting cells C1 and C2 and the substrate 110. This feature will be described in more detail below.

According to this exemplary implementation, the side surfaces of each of the light emitting cells C1 and C2 include the first inclined portion S1 that is inversely inclined, thereby improving light extraction efficiency of the light emitting diode. In addition, when the first conductive-type semiconductor layer 121 is doped with n-type impurities and the second conductive-type semiconductor layer 125 is doped with p-type impurities, the first conductive-type semiconductor layer 121 has a much greater thickness than the second conductive-type semiconductor layer 125. In this structure, the active layer 123 is disposed at a relatively upper portion of the overall semiconductor layers 120. Accordingly, by configuring the light emitting cells C1 and C2 to have an inversely inclined side surface rather than a regularly inclined side surface, the active layer 123 can have a greater effective area. Accordingly, each of the light is emitting cells has an increased effective luminous area, whereby the light emitting diode can have low forward voltage and improved luminous efficiency.

Referring again to FIG. 1 to FIG. 3, the first light emitting cell C1 can have an exposed region of the first conductive-type semiconductor layer 121, which is formed by removing parts of the second conductive-type semiconductor layer 125 and the active layer 123. The interconnection 160 is formed on the exposed region of the first conductive-type semiconductor layer 121. The interconnection allows the first light emitting cell C1 to be electrically connected to the second light emitting cell C2.

Figure 4:
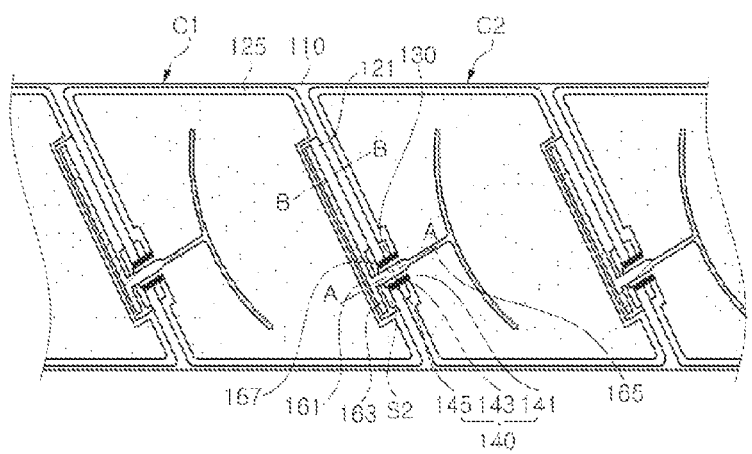
FIG. 4 is a plan view of an exemplary light emitting diode according to some implementations of the disclosed technology.

The configuration of the interconnection is not limited to the implementation described above and other implementations are also possible. For example, as shown in FIG. 4, when the light emitting diode includes three or more light emitting cells, each of the light emitting cells can include the exposed region of the first conductive-type semiconductor layer 121 at a location corresponding to the region in which the interconnection 160 is formed.

The current blocking layer 130 can formed to partially cover the second light emitting cell C2. As shown in FIG. 1 and FIG. 2, the current blocking layer 130 can partially cover an upper surface and a side surface of the second light emitting cell C2, and can extend to a region between the first light emitting cell C1 and the second light emitting cell C2.

In addition, the current blocking layer 130 can prevent the second conductive-type semiconductor layer 125 from being directly disposed under the interconnection 160, thereby preventing current crowding. Accordingly, the current blocking layer 130 can be disposed at a location corresponding to the region in which the interconnection 160 is formed. The area of the current blocking layer 130 may be greater than the region in which the interconnection 160 is formed. Thus, it is possible to prevent the second conductive-type semiconductor layer 125 from being directly connected to the interconnection 160.

The current blocking layer 130 can have insulating properties and can include, for example, a silicon oxide layer, a silicon nitride layer, or a dielectric layer. Furthermore, the current blocking layer 130 can include a distributed Bragg reflector in which layers having different indexes of refraction are stacked one above another. The current blocking layer 130 includes the distributed Bragg reflector which allows light traveling upwards from below the current blocking layer 130 and reflects light traveling downwards from above the current blocking layer 130. Thus, light extraction efficiency of the light emitting diode can be improved.

The transparent electrode layer 140 can be disposed on the light emitting cells C1 and C2. The transparent electrode layer 140 includes transparent electrode layers 141, 143 and 145 that are formed on different positions over the light emitting cells C1 and C2. The transparent electrode layer 141 can be disposed on the second conductive-type semiconductor layer 125 of each of the first and second light emitting cells C1 and C2. The transparent electrode layer 141 disposed on the second conductive-type semiconductor layer 125 of each of the first and second light emitting cells C1 and C2 can have a smaller size than the second conductive-type semiconductor layer 125 such that a portion of the second conductive-type semiconductor layer 125 can be exposed. In some implementations, an upper surface around an outer periphery of the second conductive-type semiconductor layer 125 can be exposed.

Further, the transparent electrode layer 140 can be disposed on the current blocking layer 130. The transparent electrode layer 143 and 145 can be formed on the side surface of the second light emitting cell C2 and on a region between the first and second light emitting cells C1, C2. Here, as shown in FIG. 1, the width of the transparent electrode layer 143 formed on the side surface of the second light emitting cell C2 and the width of the transparent electrode layer 145 formed on the region between the first and second light emitting cells C1, C2 can be smaller than that of the current blocking layer 130. The transparent electrode layer 145 extending from the upper surface of the second light emitting cell C2 and covering the exposed region between the first and second light emitting cells C1, C2 can farther extend than the current blocking layer 130. With this structure, the extended transparent electrode layer 145 can partially cover the side surface of the first conductive-type semiconductor layer 121 of the first light emitting cell C1. The structure of the transparent electrode layer 140 as provided above is one example and other implementations are also possible.

The transparent electrode layer 140 can include a light transmitting conductive material such as indium tin oxide (ITO) and the like. The transparent electrode layer 140 is disposed between the interconnection 160 and the second conductive-type semiconductor layer 125, thereby enabling more efficient current spreading.

The interconnection 160 electrically connects the first light emitting cell C1 to the second light emitting cell C2. Further, the interconnection 160 is formed along a surface of the first light emitting cell C1 and a surface of the second light emitting cell C2. Furthermore, the interconnection 160 can include extension sections 163 and 165 to improve current spreading is effects.

The interconnection 160 can include a first pad section 161, a first extension section 163, a second extension section 165, and a connection section 167.

The first pad section 161 can be disposed on the exposed region of the first conductive-type semiconductor layer 121 of the first light emitting cell C1, and the first extension section 163 can extend from the first pad section 161 to be disposed on the exposed region. The second extension section 165 can be disposed on the second conductive-type semiconductor layer 125 and the transparent electrode layer 141 of the second light emitting cell C2, and can extend, as shown in FIG. 1. The second extension section 165 can have any shape and any length. The connection section 167 connects the first pad section 161 to the second extension section 165 and is disposed on the side surfaces of the first and second light emitting cells C1 and C2 and on the region between the side surfaces of the first and second light emitting cells C1 and C2. The current blocking layer 130 can be disposed under the second extension section 165 and the connection section 167, and the second extension section 165 and the connection section 167 can have a smaller size than the current blocking layer 130. Accordingly, it is possible to improve current spreading effects by the current blocking layer 130.

The connection section 167 can be disposed on the side surface of the first and second light emitting cells C1, C2 having the second inclined portion S2. Accordingly, the interconnection 160 can be formed in a step coverage shape.

According to this exemplary implementation, the regularly inclined second inclined portion S2 is formed on a side where the first and second light emitting cells face to each other. Thus, the interconnection 160 can be formed in a step coverage shape. In this way, at least one of the first and second light emitting cells C1 and C2 includes the side surface having the inversely inclined first inclined portion S1 and the side surface having the second inclined portion S2. Further, the interconnection 160 is formed on the side surface having the second inclined portion S2. Accordingly, the light emitting diode according to this exemplary implementation has effects of increasing an effective luminous area and light extraction efficiency by having the side surface with the first inclined portion S1 and allowing stable formation of the interconnection 160 by having the side surface with the second inclined portion S2.

In addition, as described above, when the second inclined portion S2 has a greater width than the interconnection 160, it is possible to secure process margin for the formation of the interconnection 160. For example, when an alignment error of about 1 μm to 2 μm occurs in the formation of the interconnection 160, if the width of the second inclined portion S2 is greater than that of the interconnection 160, it is possible to prevent failure caused by an alignment error.

In some implementations, the respective sections 161, 163, 165 and 167 of the interconnection 160 can be integrally formed with one another and can include the same material. In another implementation, the respective sections of the interconnection can be separately formed and can include different materials. Further, in some implementation, the interconnection 160 can include a multilayer structure.

The protective layer 150 can cover other regions excluding the region in which the interconnection 160 is formed. The protective layer 150 can include an opening exposing a portion of the first light emitting cell C1, a portion of the second light emitting cell C2, and a portion of the upper surface of the substrate 110. The interconnection 160 can be disposed in the opening. The protective layer 150 can be formed along the surface of the light emitting diode and can have a substantially constant thickness.

The protective layer 150 can include a silicon oxide layer or a silicon nitride layer, and can improve reliability by protecting the light emitting diode from an external environment.

According to this exemplary implementation, the side surface of at least one of the first and second light emitting cells C1 and C2 is formed to have the second inclined portion S2. Thus, in a light emitting diode including a plurality of light emitting cells, the light emitting cells can be formed to have a first inclined portion S1 that is inversely inclined. Accordingly, the light emitting cells can be formed to have a side surface including the first inclined portion S1 in order to improve light extraction efficiency while increasing an effective luminous area. Further, the light emitting cells can be formed to have a side surface including the second inclined portion S2 in order to enables stable formation of the interconnection.

According to this exemplary implementation, the light emitting diode includes the first light emitting cell C1 and the second light emitting cell C2. However, other implementations are also possible that the light emitting diode can include three or more light emitting cells.

For example, as shown in FIG. 4, the light emitting diode can include additional light emitting cells in addition to the first light emitting cell C1 and the second light emitting cell C2. In this exemplary implementation, the first light emitting cell C1 and the second light emitting cell C2 can be electrically connected to the additional light emitting cells. In this implementation, the light emitting cells can be connected to one another via the interconnection 160, and in each of the light emitting cells, a portion under a region in which the interconnection 160 is formed can have a regularly inclined second inclined portion S2.

Electrical connection relationship between the first and second light emitting cells C1 and C2 as described with reference to FIG. 1 to FIG. 3 can also be applied to the light emitting diode including three or more light emitting cells. In some implementations, each of the light emitting cells can have the second inclined portions S2 that is regularly inclined at opposite side surfaces such that the first light emitting cell C1 and the second light emitting cell C2 can be electrically connected to the additional light emitting cells.

As such, the present disclosure can also be applied to the light emitting diode including three or more light emitting cells, and various modifications can be made without departing from the scope of the present disclosure.

FIG. 5 to FIG. 13 are sectional views illustrating a method of fabricating a light emitting diode according to one exemplary implementation.

According to this implementation, a method of fabricating the light emitting diode as shown in FIG. 1 to FIG. 3 is provided. Detailed descriptions of the same elements as those of the implementation illustrated in FIG. 1 to FIG. 3 are omitted.

Figure 5:
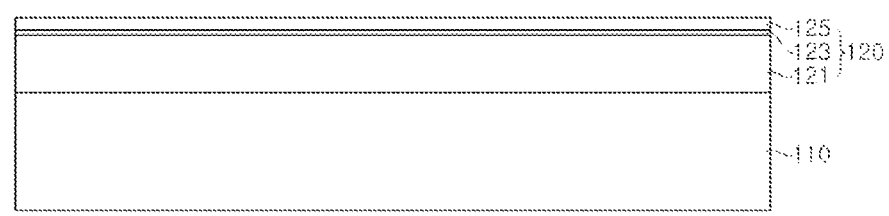
FIG. 5 through FIG. 13 are cross-sectional views illustrating an exemplary method of fabricating a light emitting diode according to some implementations of the disclosed technology.

Referring to FIG. 5, semiconductor layers 120, which include a first conductive-type semiconductor layer 121, an active layer 123 and a second conductive-type semiconductor layer 125, are formed on a substrate 110.

The substrate 110 can be or include any substrate capable of growing the semiconductor layers 120 thereon, and can include, for example, a sapphire substrate, a silicon substrate, a silicon carbide substrate, an aluminum nitride substrate, or a gallium nitride substrate. In this exemplary implementation, the substrate 110 can be or include a patterned sapphire substrate (PSS) having a convex-concave pattern (not shown).

The first conductive-type semiconductor layer 121, the active layer 123 and the second conductive-type semiconductor layer 125 can include a nitride-based semiconductor such as (Al, Ga, In)N, and can be grown on the substrate by suitable techniques including MOCVD, is MBE, HVPE, or the like.

In some exemplary implementations, a buffer layer (not shown) can be further formed on the substrate 110 before growth of the first conductive-type semiconductor layer 121. The buffer layer can relieve lattice mismatch between the semiconductor layers 120 and the substrate 110. When the substrate 110 is formed of or includes a different material than those of the semiconductor layers 120, the buffer layer can act as a nucleus layer for growth of the semiconductor layers 120.

Figure 6:
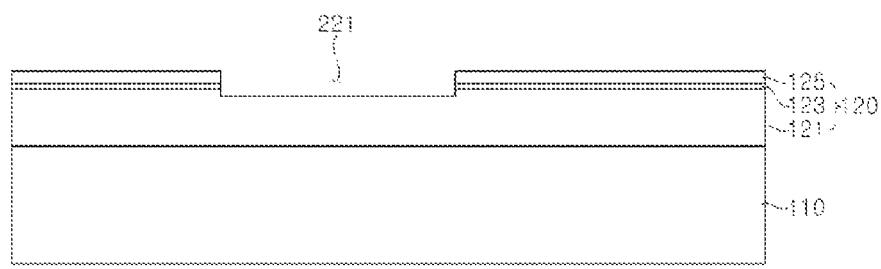

Referring to FIG. 6, some of the semiconductor layers 120, for example, some of the second conductive-type semiconductor layer 125 and the active layer 123 is removed to form an exposed region 221 of the first conductive-type semiconductor layer 121, through which an upper surface of the first conductive-type semiconductor layer 121 is partially exposed. As shown in the drawings, the first conductive-type semiconductor layer 121 can be partially further removed. With the exposed region 221 of the first conductive-type semiconductor layer 121 through which the upper surface of the first conductive-type semiconductor layer 121 is partially exposed, a mesa structure can be formed on the first light emitting cell C1 in a subsequent process.

Figure 7:
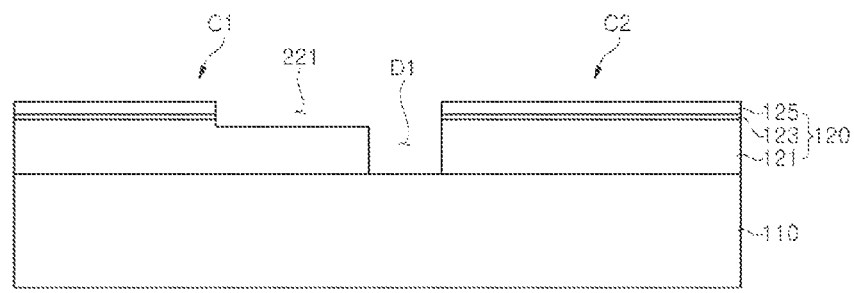

Next, referring to FIG. 7, the semiconductor layers 120 are further partially removed to form a division region D1 such that an upper surface of the substrate 110 is exposed through the divided region D1. Accordingly, the semiconductor layers 120 can be divided into the first light emitting cell C1 and the second light emitting cell C2, which are separated from each other. The first light emitting cell C1 can be separated from the second light emitting cell C2 by a distance of 3 μm to 7 μm, for example, about 5 μm.

The semiconductor layers 120 can be partially removed through photolithography and etching. In some implementations, the division region D1 can be formed by partially removing the semiconductor layers 120 through dry etching, and side surfaces of the first and second light emitting cells C1 and C2 can be formed substantially perpendicular to the substrate 110 through adjustment of characteristics of a photoresist.

In this process, the side surface of the first and second light emitting cells C1 and C2 can be formed substantially perpendicular to the upper surface of the substrate 110, whereby the side surfaces of the light emitting cells can be formed to have various inclinations including is an inverse inclination and a regular inclination by a subsequent process.

The first light emitting cell C1 can include the exposed region 221 of the first conductive-type semiconductor layer formed by partially removing the second conductive-type semiconductor layer 125 and the active layer 123 such that the first conductive-type semiconductor layer 121 can be partially exposed through the exposed region 221.

Figure 8:
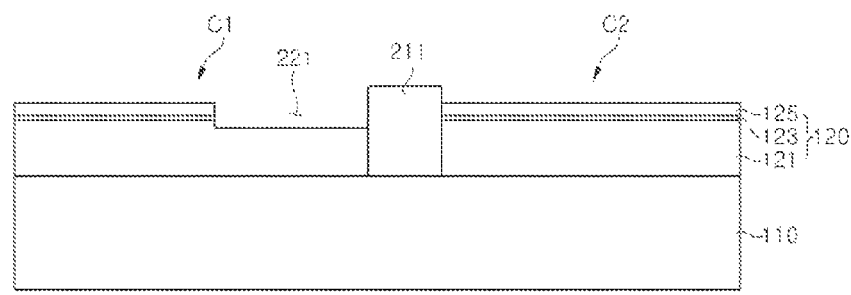
Figure 8:
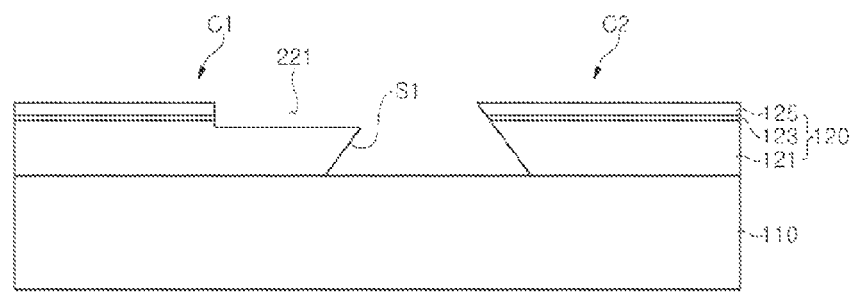

Referring to FIG. 8, a first inclined portion S1 is formed on a portion of a side surface of each of the light emitting cells C1 and C2. FIG. 8(a) is a sectional view taken along line A-A of FIG. 1 and FIG. 8(b) is a sectional view taken along line B-B of FIG. 1.

Formation of the first inclined portion S1 on a portion of the side surface of each of the light emitting cells C1 and C2 can include forming a first inclined portion S1 that is inversely inclined on the side surface of each of the light emitting cells C1 and C2 through, for example, wet etching. For example, when the side surfaces of the light emitting cells C1 and C2 are subjected to etching using an etchant including sulfuric acid and/or phosphoric acid, the inversely inclined first inclined portion S1 can be formed as shown in 8.

On the other hand, as shown in FIG. 8(a), a mask 211 is formed to prevent the first inclined portion S1 from being formed thereon. In some implementations, the mask 211 is formed on other portions except the portion where the first inclined portion S1 is formed. Accordingly, portions of the side surfaces of each of the light emitting cells C1 and C2 are maintained to have an inclination substantially perpendicular to the upper surface of the substrate. A second inclined portion S2 can be formed on those portions of the side surfaces having a perpendicular inclination by a subsequent process.

In this exemplary implementation, a portion of the side surfaces of each of the first and second light emitting cells C1 and C2 is protected by the mask 211, and other portions of the side surfaces are partially etched by the etchant to form the first inclined portion S1 on the side surfaces thereof.

Figure 9:
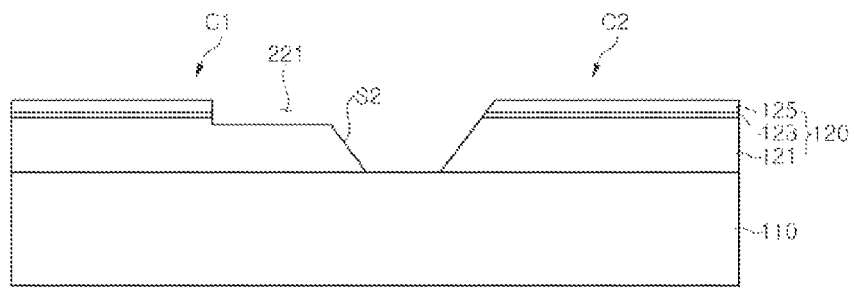

Next, referring to FIG. 9, a regularly inclined second inclined portion S2 is formed through suitable techniques including photolithography and etching on a portion of the side surface, in which the first inclined portion S1 is not formed in FIG. 8(a). Accordingly, the second inclined portion S2 is formed on the side surfaces of each of the first and second light emitting cells C1 and C2 that face each other.

Formation of the second inclined portion S2 on the side surfaces of each of the is first and second light emitting cells C1 and C2 can be performed using dry etching, and the regularly inclined side surfaces of the first and second light emitting cells C1 and C2 can be formed through adjustment of characteristics of a photoresist.

Figure 10:
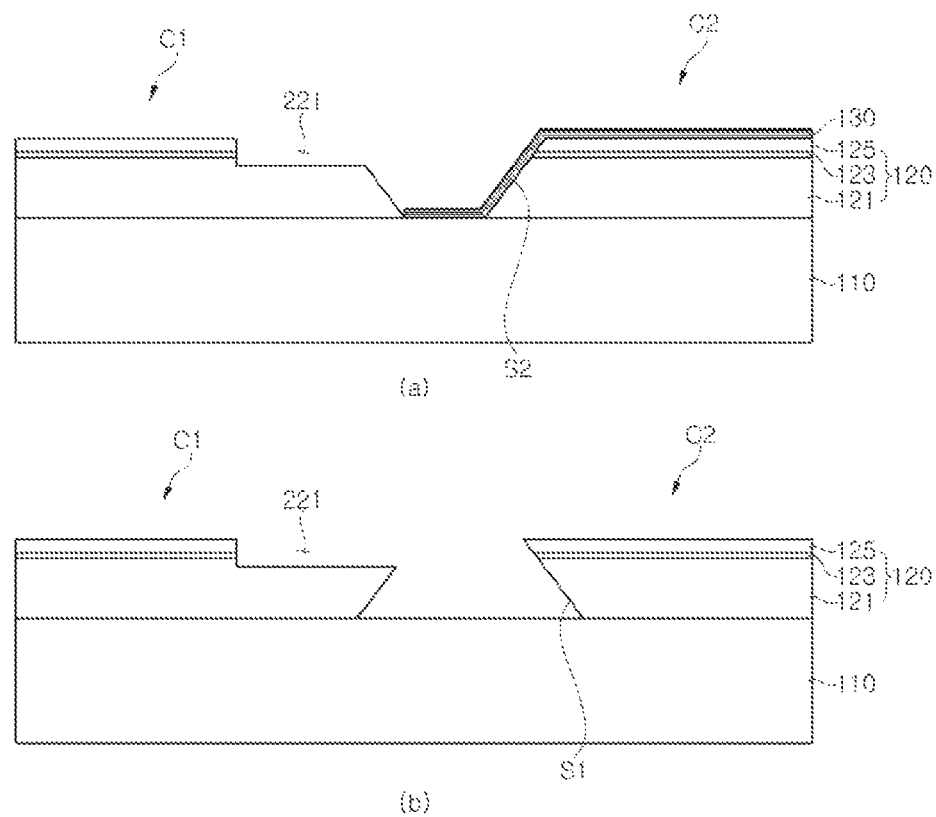

Next, FIG. 10(a) is a sectional view taken along line A-A of FIG. 1 and FIG. 10(b) is a sectional view taken along line B-B of FIG. 1. Referring to FIG. 10, a current blocking layer 130 is formed to partially cover an upper surface and a side surface of the second light emitting cell C2. In addition, the current blocking layer 130 can also be formed to cover the exposed upper surface of the substrate 110 between the first and second light emitting cells C1 and C2. In some implementations, the current blocking layer 130 can be formed on the side surface of the second light emitting cell C2 having the second inclined portion S2. Accordingly, as shown in FIG. 10(b), the current blocking layer 130 may not be formed on the side surface having the first inclined portion S1.

The current blocking layer 130 can be formed in a region corresponding to a region in which the interconnection 160 will be formed by a subsequent process. Further, the region of the current blocking layer 130 can have a greater area than the region in which the interconnection 160 will be formed. Accordingly, the shape and region of the current blocking layer 130 can be adjusted in various ways depending upon a location at which the interconnection 160 will be formed.

The current blocking layer 130 can include an insulating material, and can be formed by patterning the insulating material through suitable techniques including photolithography and etching. Alternatively, the current blocking layer 130 can be formed by a lift-off process. In some implementations, the current blocking layer 130 can be formed as a distributed Bragg reflector, which is formed by alternately staking layers having different indexes of refraction, for example, $SiO_2$ layers and $TiO_2$ layers.

Figure 11:
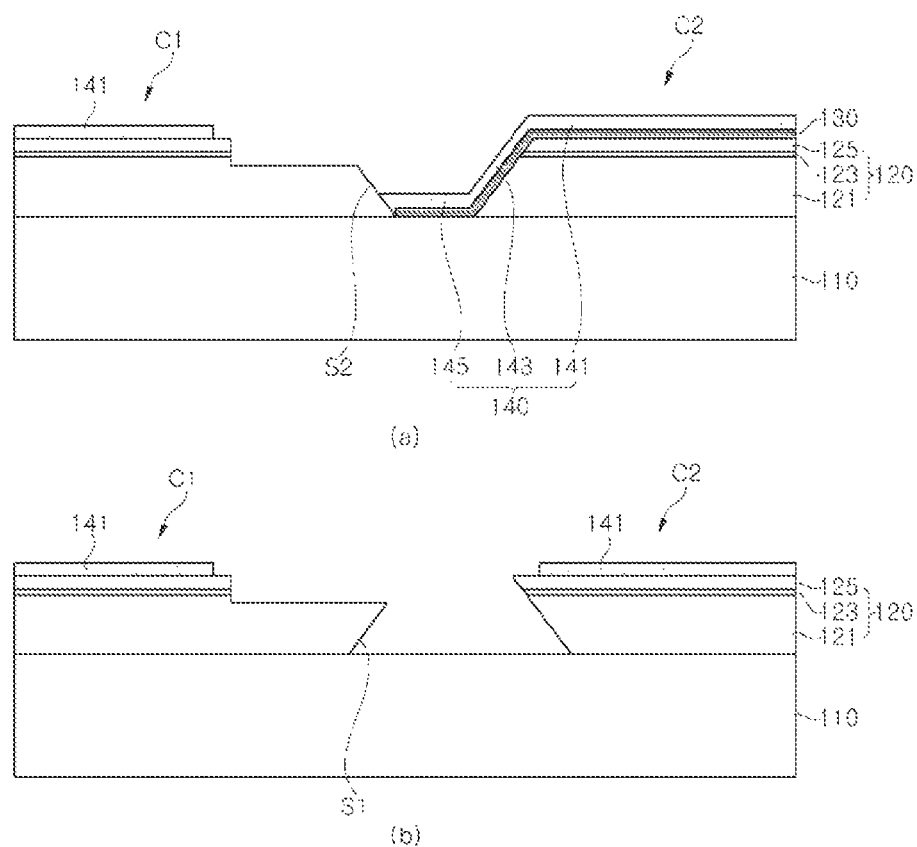

FIG. 11(a) is a sectional view taken along line A-A of FIG. 1 and FIG. 11(b) is a sectional view taken along line B-B of FIG. 1. Referring to FIG. 11, a transparent electrode layer 140 can be formed on the first light emitting cell C1 and the second light emitting cell C2.

The transparent electrode layer 140 can include a conductive oxide such as ITO or ZnO, or a light transmitting metal layer such as Ni/Au, and can be formed by suitable techniques is including deposition and a lift-off process. The transparent electrode layer 140 can be formed on the second conductive-type semiconductor layer 125 of each of the light emitting cells C1 and C2, and can have a smaller area than the second conductive-type semiconductor layer 125. Further, the transparent electrode layer 140 can be formed to partially cover the side surface of the second light emitting cell C2 having the second inclined portion S2 and a region between the first and second light emitting cells C1 and C2. Accordingly, the transparent electrode layer 140 can at least partially cover the current blocking layer 130.

In some implementations, the transparent electrode layer 140 may not be formed on the exposed region 221 of the first conductive-type semiconductor layer 121 of the first light emitting cell C1.

Figure 12:
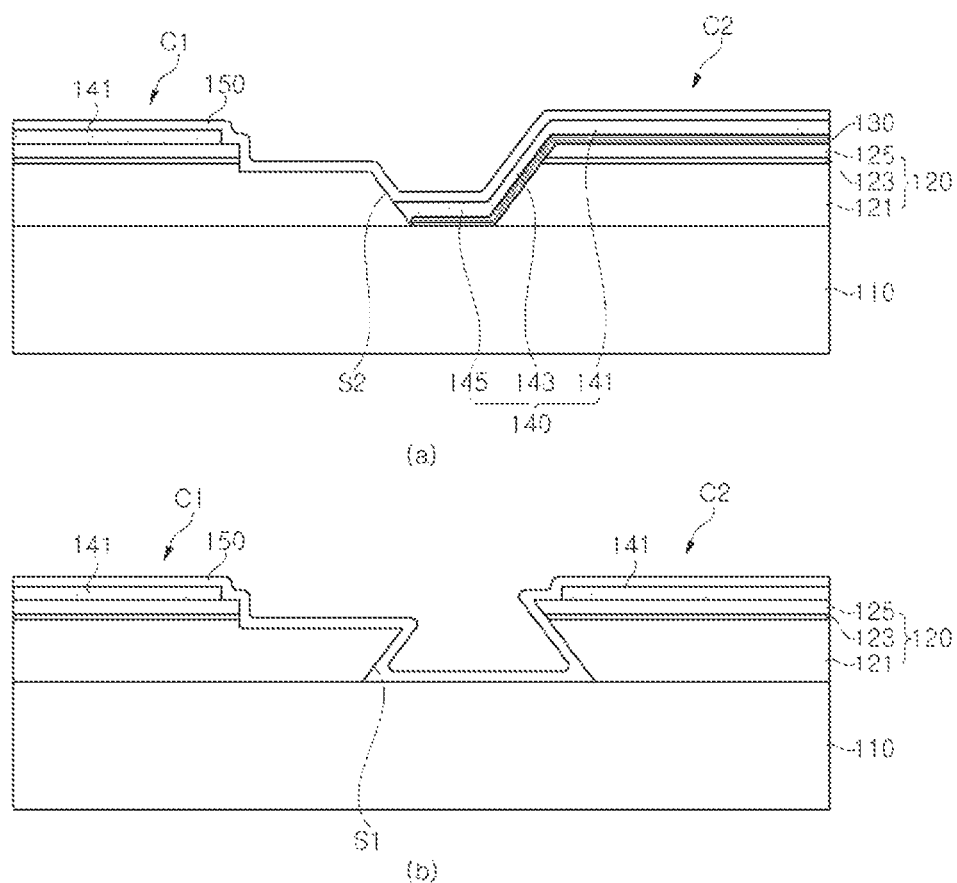

Next, FIG. 12(a) is a sectional view taken along line A-A of FIG. 1 and FIG. 12(b) is a sectional view taken along line B-B of FIG. 1. Referring to FIG. 12, a protective layer 130 can be formed to cover the light emitting cells C1 and C2 and the exposed upper surface of the substrate 110.

The protective layer 130 can include a silicon oxide or a silicon nitride, and can be formed by a deposition process such as chemical vapor deposition or e-beam evaporation. The protective layer 130 is formed by the deposition process and thus can be formed along the surfaces of the light emitting cells C1 and C2 and the exposed upper surface of the substrate 110. For example, the protective layer 130 has a shape corresponding to the surfaces of the light emitting cells C1 and C2 and the exposed upper surface of the substrate 110.

Figure 13:
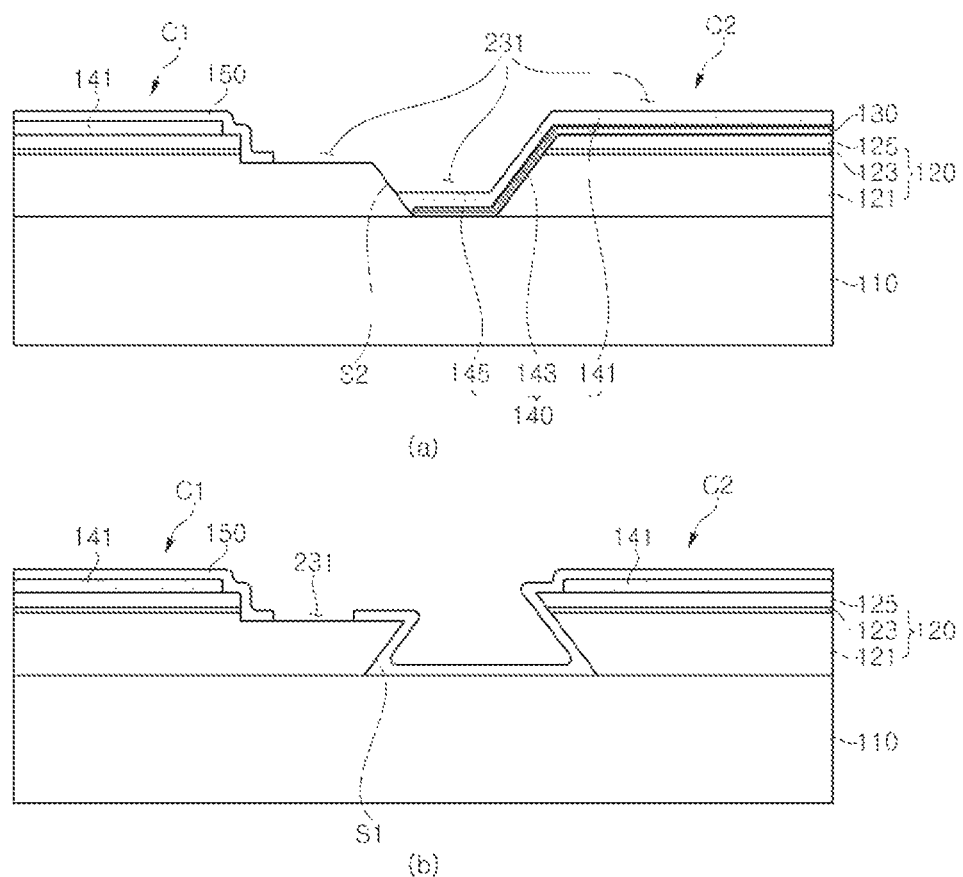

FIG. 13(a) is a sectional view taken along line A-A of FIG. 1 and FIG. 13(b) is a sectional view taken along line B-B of FIG. 1. Referring to FIG. 13, an opening 231 is formed by partially removing the protective layer 130.

The opening 231 can be formed by photolithography and etching. In addition, the opening 231 can be formed at a location corresponding to the region in which the interconnection 160 will be formed. Accordingly, the opening 231 can be formed on a portion of the exposed region 221 of the first conductive-type semiconductor layer 121 of the first light emitting cell C1, a portion of the region between the first light emitting cell C1 and the second light emitting cell C2, a portion of the side surface having the second inclined portion S2, and a portion of the upper surface of the second light emitting cell C2.

Then, a conductive material is formed on the opening 231 to form the is interconnection 160. As a result, a light emitting diode as shown in FIG. 1 to FIG. 3 is provided. The interconnection 160 can include, for example, a metal, and can be formed by plating, e-beam evaporation, or sputtering. Since the interconnection 160 is formed on the second inclined portion S2, the interconnection 160 can have a step coverage shape and electrically connect the first light emitting cell C1 to the second light emitting cell C2.

In this way, some portions of the side surfaces of each of the first and second light emitting cells C1, C2 are formed to have the second inclined portion S2 that is regularly inclined, thereby enabling stable formation of the interconnection 160 in the step coverage shape. Accordingly, in a light emitting diode including a plurality of light emitting cells, each of the light emitting cells can be formed to have the first inclined portion S1 that is inversely inclined on a side surface thereof while forming the interconnection 160 in the step coverage shape.

According to this exemplary implementation, the method is applied to fabrication of the light emitting diode including the first light emitting cell C1 and the second light emitting cell C2. However, it should be understood that the present disclosure is not limited thereto and the method according to the present disclosure can also be applied to light emitting diodes including three or more light emitting cells.

For example, as shown in FIG. 4, when the light emitting diode includes additional light emitting cells in addition to the first light emitting cell C1 and the second light emitting cell C2, the first light emitting cell C1 and the second light emitting cell C2 can be electrically connected to the additional light emitting cells. In this exemplary implementation, the method can be applied to formation of the structure for electrically connecting the plurality of light emitting cells to one another. For example, electrical connection relationship between the first and second light emitting cells C1 and C2 as described with reference to FIG. 1 to FIG. 3 can also be applied to the light emitting diode including three or more light emitting cells.

Accordingly, as shown in FIG. 4, the fabrication method can also be applied to both side surfaces of each of the light emitting cells such that the first light emitting cell C1 and the second light emitting cell C2 can be electrically connected to the additional light emitting cells.

Furthermore, although the above exemplary implementations have been described as serially connecting the first light emitting cell C1 to the second light emitting cell is C2, other implementations are also possible. For example, the light emitting cells can be electrically connected to each other in parallel, or in reverse parallel, or in combination of series, parallel and reverse parallel connection.

Although certain exemplary embodiments and implementations have been described herein, other embodiments and modifications will be provided from this description. Accordingly, the inventive concept is not limited to such embodiments, but rather to the broader scope of the presented claims and various obvious modifications and equivalent arrangements.

What is claimed is:

1. A light emitting diode comprising:
a substrate;
a first light emitting cell and a second light emitting cell disposed over the substrate and separated from each other; and
an interconnection electrically connecting the first light emitting cell to the second light emitting cell,
wherein each of the first and second light emitting cells includes a first conductive-type semiconductor layer, a second conductive-type semiconductor layer disposed over the first conductive-type semiconductor layer, and an active layer disposed between the first conductive-type semiconductor layer and the second conductive-type semiconductor layer,
wherein at least one of the first light emitting cell and the second light emitting cell includes a side surface inclined with respect to the substrate, and wherein the side surface includes a first inclined portion forming an acute angle with respect to the substrate, a second inclined portion forming an obtuse angle with respect to the substrate, and an inclination discontinuity section disposed between the first inclined portion and the second inclined portion, and the first inclined portion and the second inclined portion are formed along a longitudinal direction of the light emitting cell, and wherein the first inclined portion and the second inclined portion are in separate regions along the longitudinal direction of the light emitting cell.

2. The light emitting diode of claim 1, wherein the interconnection is disposed over the second inclined portion.

3. The light emitting diode of claim 2, wherein each of the first and second light emitting cells includes the side surface with the side surfaces of the light emitting cells disposed to face each other, and the second inclined portion of the side surface of the first light emitting cell is disposed at a location corresponding to the second inclined portion of the side surface of the second light emitting cell.

4. The light emitting diode of claim 3, wherein the side surface of each of the first and second light emitting cells include the first inclined portion on a region different from the location of the second inclined portion.

5. The light emitting diode of claim 1, wherein the first conductive-type semiconductor layer has a greater thickness than the second conductive-type semiconductor layer.

6. The light emitting diode of claim 1, wherein each of the first and second light emitting cells further includes a transparent electrode layer disposed over at least a portion of the first and second light emitting cells, and the interconnection is disposed over the transparent electrode layer.

7. The light emitting diode of claim 6, further including:
a current blocking layer disposed over at least a portion of the second light emitting cell, wherein the current blocking layer is disposed under the transparent electrode layer to correspond to the interconnection.

8. The light emitting diode of claim 7, wherein the current blocking layer further extends to the side surface of the second light emitting cell and a region between the first light emitting cell and the second light emitting cell, the extended current blocking layer being disposed over the second inclined portion of the second light emitting cell.

9. The light emitting diode of claim 8, wherein the transparent electrode layer further extends to the side surface of the second light emitting cell and the region between the first light emitting cell and the second light emitting cell to be disposed over the current blocking layer.

10. The light emitting diode of claim 7, wherein the current blocking layer includes a distributed Bragg reflector.

11. The light emitting diode of claim 1, further including:
a protective layer covering the first and second light emitting cell except a region in which the interconnection is disposed.

12. The light emitting diode of claim 1, further including:
at least one additional light emitting cell electrically connected to the first and second light emitting cells via the interconnection.

13. A light emitting device comprising:
a substrate; and
at least one light emitting cell disposed over the substrate, wherein the at least one light emitting cell includes a side surface inclined with respect to the substrate, and
wherein the side surface includes a first inclined portion forming an acute angle with respect to the substrate, a second inclined portion forming an obtuse angle with respect to the substrate, and an inclination discontinuity section disposed between the first inclined portion and the second inclined portion, and the first inclined portion and the second inclined portion are formed along a longitudinal direction of the light emitting cell, and wherein the first inclined portion and the second inclined portion are in separate regions along the longitudinal direction of the light emitting cell.

14. The light emitting device of claim 13, further including:
an additional light emitting cell electrically connected to the light emitting cell via an interconnection, and
wherein a side surface of the additional light emitting cell facing the side surface of the light emitting cell includes a first inclined portion forming an acute angle with respect to the substrate and a second inclined portion forming an obtuse angle with respect to the substrate.

15. A light emitting diode comprising:
a substrate;
a first light emitting cell and a second light emitting cell disposed over the substrate and separated from each other; and
an interconnection electrically connecting the first light emitting cell to the second light emitting cell,
wherein each of the first and second light emitting cells includes a first conductive-type semiconductor layer, a second conductive-type semiconductor layer disposed over the first conductive-type semiconductor layer, and an active layer disposed between the first conductive-type semiconductor layer and the second conductive-type semiconductor layer,
wherein at least one of the first light emitting cell and the second light emitting cell includes a side surface inclined with respect to the substrate,
wherein the side surface includes a first inclined portion forming an acute angle with respect to the substrate, a second inclined portion forming an obtuse angle with respect to the substrate, and an inclination discontinuity section disposed between the first inclined portion and the second inclined portion,
wherein a current blocking layer further extends to the side surface of the second light emitting cell and a region between the first light emitting cell and the second light emitting cell, the extended current blocking layer being disposed over the second inclined portion of the second light emitting cell, and
wherein a transparent electrode layer further extends to the side surface of the second light emitting cell and the region between the first light emitting cell and the second light emitting cell to be disposed over the current blocking layer.

16. The light emitting diode of claim 15, wherein the interconnection is disposed over the second inclined portion.

17. The light emitting diode of claim 15, wherein the first conductive-type semiconductor layer has a greater thickness than the second conductive-type semiconductor layer.

18. The light emitting diode of claim 15, wherein each of the first and second light emitting cells further includes the transparent electrode layer disposed over at least a portion of the first and second light emitting cells, and the interconnection is disposed over the transparent electrode layer.

19. The light emitting diode of claim 15, further including:
a protective layer covering the first and second light emitting cell except a region in which the interconnection is disposed.

20. The light emitting diode of claim 15, further including:
   at least one additional light emitting cell electrically connected to the first and second light emitting cells via the interconnection.

* * * * *